United States Patent
Sasaki

(10) Patent No.: US 6,570,441 B1
(45) Date of Patent: May 27, 2003

(54) INCOHERENT DEMODULATOR AND METHOD OF INCOHERENTLY DEMODULATING AN IF SIGNAL

(75) Inventor: Eisaku Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/705,781

(22) Filed: Nov. 6, 2000

(30) Foreign Application Priority Data

Nov. 5, 1999 (JP) ............................................ 11-316128

(51) Int. Cl.$^7$ ................................................ H03D 3/00
(52) U.S. Cl. ........................ 329/306; 329/304; 329/308; 375/344; 375/345; 375/324
(58) Field of Search ................................ 329/304, 306, 329/308; 375/344, 345, 324

(56) References Cited

U.S. PATENT DOCUMENTS

| 6,121,828 A | * | 9/2000 | Sasaki | ........................ 329/304 |
| 6,310,513 B1 | * | 10/2001 | Iemura | ........................ 329/304 |

FOREIGN PATENT DOCUMENTS

| JP | 5-211493 | 8/1993 |
| JP | 6-152676 | 5/1994 |
| JP | 6-205067 | 7/1994 |
| JP | 10-41992 | 2/1998 |
| JP | 10-341267 | 12/1998 |
| JP | 11-168445 | 6/1999 |
| JP | 11-331291 | 11/1999 |
| JP | 2000-216839 | 8/2000 |
| JP | 2000-244592 | 9/2000 |

* cited by examiner

*Primary Examiner*—Arnold Kinkead
(74) *Attorney, Agent, or Firm*—McGinn & Gibb, PLLC

(57) ABSTRACT

A demodulator includes a pair of analog mixers for incoherently demodulating modulated orthogonal signals with orthogonal local carriers to produce a pair of analog baseband signals, there being a phase rotation in the analog orthogonal baseband signals resulting from the incoherent demodulation. The analog baseband signals are converted to first and second digital signals. One of these is scaled by a gain controlled circuitry so that a difference between the average power values of the scaled first digital signal and the second digital signal is zero. The inter-channel rotating phase contained in the outputs of the gain controlled circuitry is removed by a phase shifter. The gain controlled circuitry may include a digital multiplier for multiplying the first digital signal with a control signal to produce a scaled first digital signal, averaging circuits for producing a first average value representing the average power of the scaled first digital signal and a second average value representing the average power of the second digital signal, and a control circuit for deriving a signal from the first and second average values and supplying the signal to the digital multiplier as the aforesaid control signal so that the difference between the first and second average values reduces to zero.

16 Claims, 5 Drawing Sheets

INCOHERENT DEMODULATOR AND METHOD OF INCOHERENTLY DEMODULATING AN IF SIGNAL

BACKGROUND OF THE INVENTION

1. Field of the Invention

The present invention relates generally to incoherent demodulators, and more specifically to an incoherent demodulator having an improved converging performance at signal points and excellent stability against low-speed phase rotation.

2. Description of the Related Art

A prior art demodulator, as shown in FIG. 1, receives a QAM (quadrature amplitude modulated) IF signal from a down-converter, not shown, and includes a pair of analog mixers 21 and 22 in which the IF signal is mixed with orthogonal carriers. A local oscillator 41 produces an in-phase IF carrier that is supplied to the mixer 21. The in-phase IF carrier is π/2 phase-shifted in a phase shifter 42 to produce a quadrature IF carrier which is fed to the mixer 22. Mixers 21 and 22 perform multiplication between the received IF signal and the sinusoidal waveforms of the orthogonal IF carriers to detect in-phase (P) and quadrature (Q) baseband components for respective channels. Undesired high frequency components of the P- and Q-channel baseband signals are eliminated by analog low-pass filters 31 and 32, respectively.

Since the frequency of the local carriers is very close to, but not synchronized to, the frequency of the received IF signal, there exists a small phase rotation. In addition, variability inherent in the operating characteristics of these analog circuits causes the recovered baseband signals to vary in amplitude independently of each other with varying ambient temperature. As a result, there is a small power difference between the P- and Q-channel baseband signals.

The P and Q analog baseband signals from the low-pass filters are converted to digital baseband signals by A/D converters 61 and 62. The output signals of the A/D converters 61, 62 are supplied to a digital endless phase shifter (EPS) 80. Phase shifter 80 is comprised of a numerical controlled oscillator (NCO) and digital circuits. Using the digital orthogonal carriers, the endless phase shifter 80 removes the demodulator's inter-channel rotating phase difference according to the following equations and produces output signals P' and Q':

$$P' = P^* \cos \theta - Q^* \sin \theta$$

$$Q' = P^* \sin \theta - Q^* \cos \theta$$

where θ represents the phase angle which is controlled by the phase shifter 80 so that its output signals P' and Q' would be exactly what is recovered if the locally generated orthogonal IF carriers were precisely synchronized to the received orthogonal IF carriers. More specifically, if the angle of phase rotation between the recovered P- and Q-channel baseband signals is equal to θ(t), the phase shifter 80 introduces a time-varying phase shift of −θ(t) to the input P- and Q-channel signals.

Similar to the power difference between the recovered P- and Q-channel baseband signals, there is a power difference between the baseband signals which is produced by the transmitter's modulator as a result of the variability of its analog components. This modulator's baseband power difference is eliminated by automatic gain control (AGC) circuits 91 and 92 connected to the outputs of phase shifter 80. Additionally, the AGC circuits 91 and 92 monitor their outputs to detect their offset values from prescribed levels and control their output levels so that they confirm to the prescribed levels.

The baseband power difference caused by the analog demodulator is reduced by a closed-loop AGC control circuit 70 formed by a difference detector 71, an integrator 72 and a multiplier 73. Difference detector 71 is connected to the outputs of AGC circuits 91 and 92 to detect a difference which exists between the output levels of these AGC circuits according to the phase rotation angle θ detected by the phase shifter 80. The output of the difference detector 71 is integrated by the integrator 72 to produce a gain control signal, which is applied to the multiplier 73. The output of the integrator 72 is used in the multiplier 73 to control the amplitude of the P-channel input signal of the digital phase shifter 80 from the A/D converter 61. By the feedback operation of the closed loop 70, the baseband power difference between the recovered baseband signals reduces towards zero.

However, the inter-channel power difference of the demodulator cannot be completely eliminated by the closed-loop AGC control circuit 70. As a result, the demodulator suffers degradation in converging performance at signal points in the 16-QAM signal constellation. As shown in FIG. 2, due to the degraded convergence performance, the size of signal points in the 16-QAM signal constellation increases with distance from the center of the constellation. Hence, the bit error rate performance of the demodulator suffers degradation. In addition, if the inter-channel phase rotation varies at a considerably low speed (or near zero), the control signals of all AGC circuits 70, 91 and 92 will assume an equal value, causing the demodulator to enter an unstable state if these circuits have substantially the same time constant value. On the other hand, if the AGC circuit 70 has a greater time constant value than the AGC circuits 91, 92, the former ceases to function properly and the latter takes control to absorb the inter-channel power difference. When the phase rotation begins increasing its speed under such conditions, an error would result until the demodulator is stabilized. Similar problems occur in an interference canceller for cancelling interference between cross-polarizations.

SUMMARY OF THE INVENTION

It is therefore an object of the present invention to provide an incoherent demodulator that is improved in terms of convergence performance and stability against low speed phase rotation.

According to a first aspect of the present invention, there is provided an incoherent demodulator comprising local oscillator circuitry for producing a pair of orthogonal carriers, a pair of analog mixers for incoherently demodulating a pair of modulated orthogonal signals with the orthogonal carriers to produce a pair of analog orthogonal baseband signals, there being a phase rotation in the analog orthogonal baseband signals resulting from the incoherent demodulation of the modulated signals. A pair of analog-to-digital converters process the analog orthogonal baseband signals to produce first and second digital signals. Gain controlled circuitry is provided for scaling the first digital signal so that a difference which exists between average power of the scaled first digital signal and average power of the second digital signal reduces to zero. A digital phase shifter processes the first and second output signals of the gain controlled circuitry so that the processed first and second output signals no longer contain the phase rotation.

In a preferred embodiment, the gain controlled circuitry includes a digital multiplier for multiplying the first digital signal with a control signal to produce a scaled first digital signal, averaging circuitry for producing a first average value representing the average power of the scaled first digital signal and a second average value representing the average power of the second digital signal, and control circuitry for deriving a signal from the first and second average values and supplying the signal to the digital multiplier as the control signal so that a difference which exists between the first and second average values reduces to zero.

According to a second aspect of the present invention, there is provided an incoherent demodulator system for a cross-polarization communication system, comprising a common local oscillator for producing a pair of orthogonal carriers, a pair of first and second demodulators for receiving first and second cross-polarized signals, respectively, and an interference canceller for cancelling interference between the first and second cross-polarized signals. Each of the first and second demodulators includes a pair of analog mixers for incoherently demodulating a pair of modulated orthogonal signals with the orthogonal carriers to produce a pair of analog orthogonal baseband signals, there being a phase rotation in the analog orthogonal baseband signals resulting from the incoherent demodulation of the modulated signals. A pair of analog-to-digital converters process the analog orthogonal baseband signals to produce first and second digital signals. Gain controlled circuitry is provided for scaling the first digital signal so that a difference which exists between average power of the scaled first digital signal and average power of the second digital signal reduces to zero. A digital phase shifter processes the first and second output signals of the gain controlled circuitry so that the processed first and second output signals no longer contain the phase rotation. First and second automatic gain controlled circuits respectively process the first and second digital output signals processed by the digital phase shifter to produce amplitude-controlled digital output signals whose amplitudes are maintained at a predetermined value. The amplitude-controlled digital output signals produced by the first and second AGC circuits of the first demodulator are supplied to the interference canceller, and replicas of the amplitude-controlled digital output signals produced by the first and second AGC circuits of the second demodulator are supplied to the interference canceller as interference cancelling signals.

According to a third aspect, the present invention provides a demodulation method comprising the steps of incoherently demodulating a pair of modulated orthogonal signals with a pair of orthogonal carriers to produce a pair of analog orthogonal baseband signals, there being a phase rotation in the analog orthogonal baseband signals resulting from the incoherent demodulation of the modulated signals, converting the analog orthogonal baseband signals to first and second digital signals, scaling the first digital signal so that a difference which exists between average power of the scaled first digital signal and average power of the second digital signal reduces to zero, and removing the phase rotation which exists between the scaled first digital signal and the second digital signal.

BRIEF DESCRIPTION OF THE DRAWINGS

The present invention will be described in further detail with reference to the accompanying drawings, in which.

DETAILED DESCRIPTION

Figure 2:
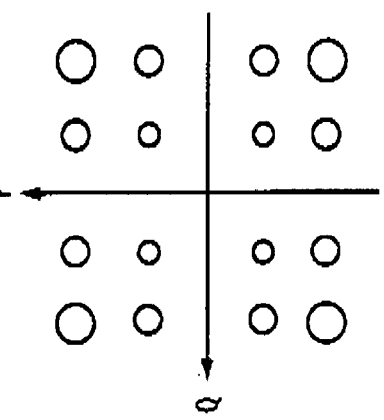
FIG. 2 shows a signal constellation of the prior art digital demodulator.
Figure 1:
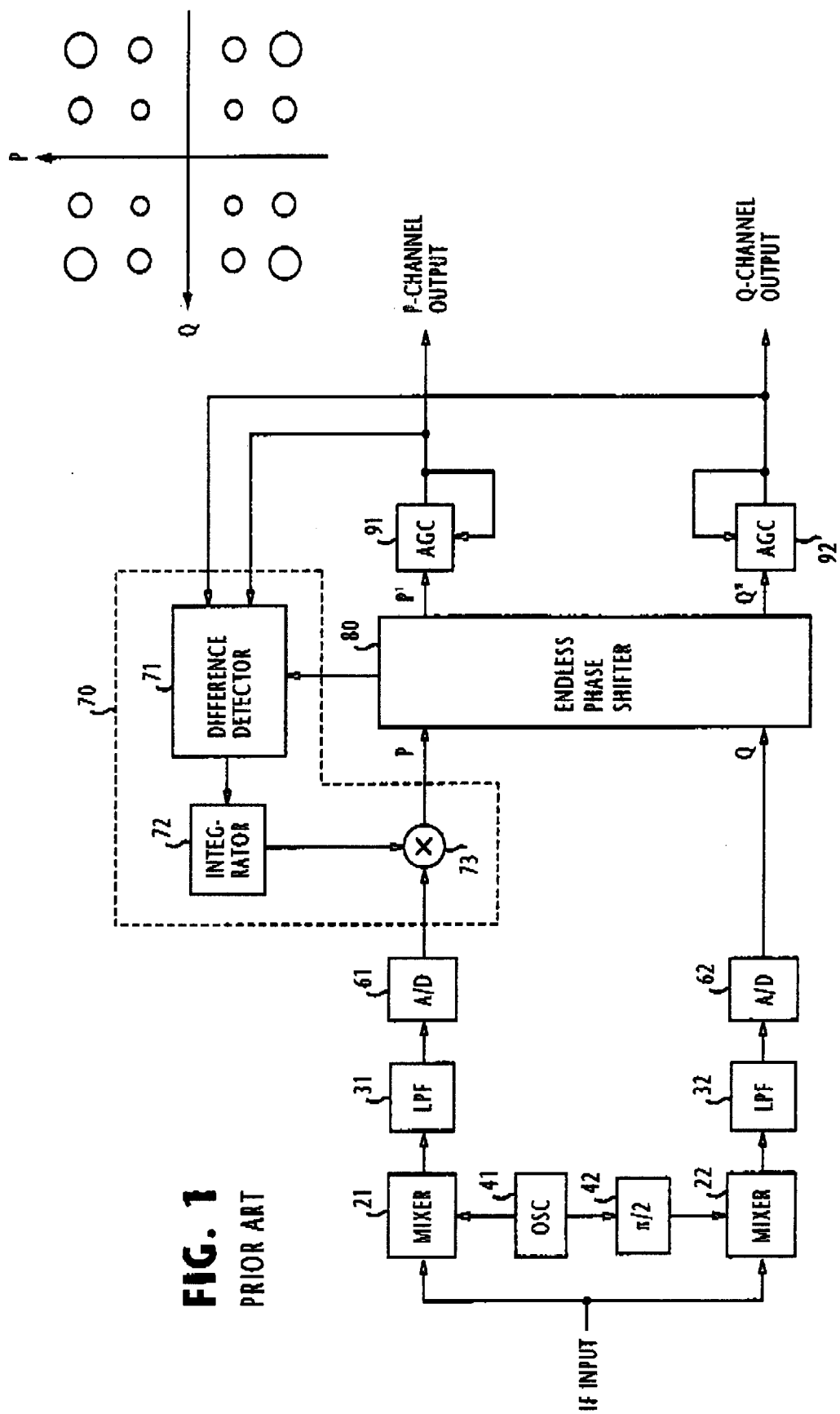
FIG. 1 is a block diagram of a prior art digital demodulator.
Figure 3:
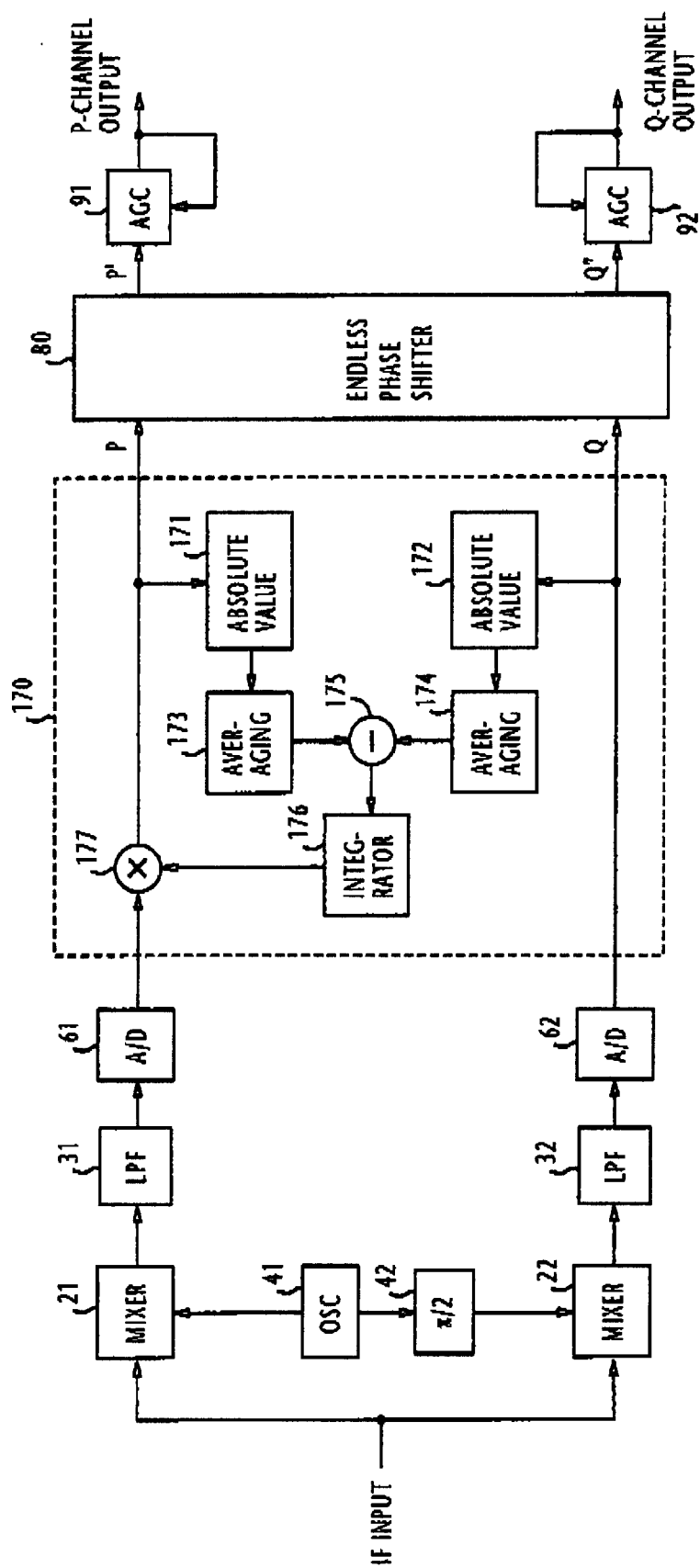
FIG. 3 is a block diagram of an incoherent demodulator according to a first embodiment of the present invention.

A demodulator according to a first embodiment of the present invention is shown in FIG. 3. Instead of the closed loop AGC circuit 70 of the FIG. 1 prior art, the demodulator of the present invention is provided with a digital AGC circuit 170 which receives the output signals of A/D converters 61 and 62 and provides its output signals to the digital phase shifter 80.

The AGC circuit 170 is comprised of a digital multiplier 177 and a pair of digital absolute-value circuits 171 and 172. Digital multiplier 177 is connected to the output of A/D converter 61 to control the amplitude of the P-channel baseband signal according to a control signal supplied from a digital integrator 176. Absolute-value circuit 711 is connected to the output of multiplier 177 to produce an absolute value of the amplitude of the controlled P-channel baseband signal. Absolute-value circuit 172 is connected to the output of A/D converter 62 to produce an absolute value of the amplitude of Q-channel baseband signal. Digital averaging circuits 173 and 174 are connected to the outputs of the absolute value circuits 171 and 172, respectively. Each of the averaging circuits integrates a predetermined number of absolute values received from the associated absolute value circuit and divides the integrated value by the predetermined number to produce an output signal representing the average power level of the digital baseband signal of the associated channel.

A comparator 175 compares the average values and an produces a digital output indicating which of the average values is greater. Comparator 175 produces a "0" when the P-channel signal is greater than the Q-channel signal, or a "1" otherwise. The output of digital comparator 175 is integrated over time in an integrator 176. As a result, the output of integrator 175 is incremented in the negative sense to assume a value lower than "1" when the P-channel signal is greater than the Q-channel signal and incremented in the positive sense when the P-channel is smaller than the Q-channel signal to assume a value greater than "1".

The output signal of integrator 175 is supplied to the digital multiplier 177 as an amplitude control signal, where it is multiplied with the P-channel signal. It is seen that when the P-channel signal is greater than the Q-channel signal, the amplitude of the P-channel signal is decreased until it equals the Q-channel signal. When the P-channel signal is smaller than the Q-channel signal, the amplitude of the P-channel signal is increased until it equals the Q-channel signal. As a result of the operation of AGC circuit 170, the difference power that exists between the average power of the P-channel digital baseband signal and the average power of the Q-channel digital signal reduces to zero.

Since the AGC circuit 170 operates independently of the operation of the AGC circuits 91 and 92, the phase rotation of the inter-channel power difference produced by the phase shifter 80 is not taken into account in the process of reducing the inter-channel power difference to zero. Thus, the demodulator's convergence performance of the demodulator at the outputs of phase shifter 80 is made constant for all signal points of the QAM signal constellation regardless of the power difference between the P- and Q-channel analog baseband signals. Hence, AGC control stability against low-speed phase rotation is achieved and the degradation of the demodulator bit error rate is prevented. Operating parameters such as delays and time constant values within the respective AGC loops can be chosen independently at optimum values.

Since the output signals of digital endless phase shifter 80 are synchronized to the signals on the modulator side of the communication system, the inter-channel power difference on the modulator side constantly appears at the outputs of the phase shifter 80. This modulator-side inter-channel power difference is absorbed by the AGC circuits 91 and 92.

Figure 4:
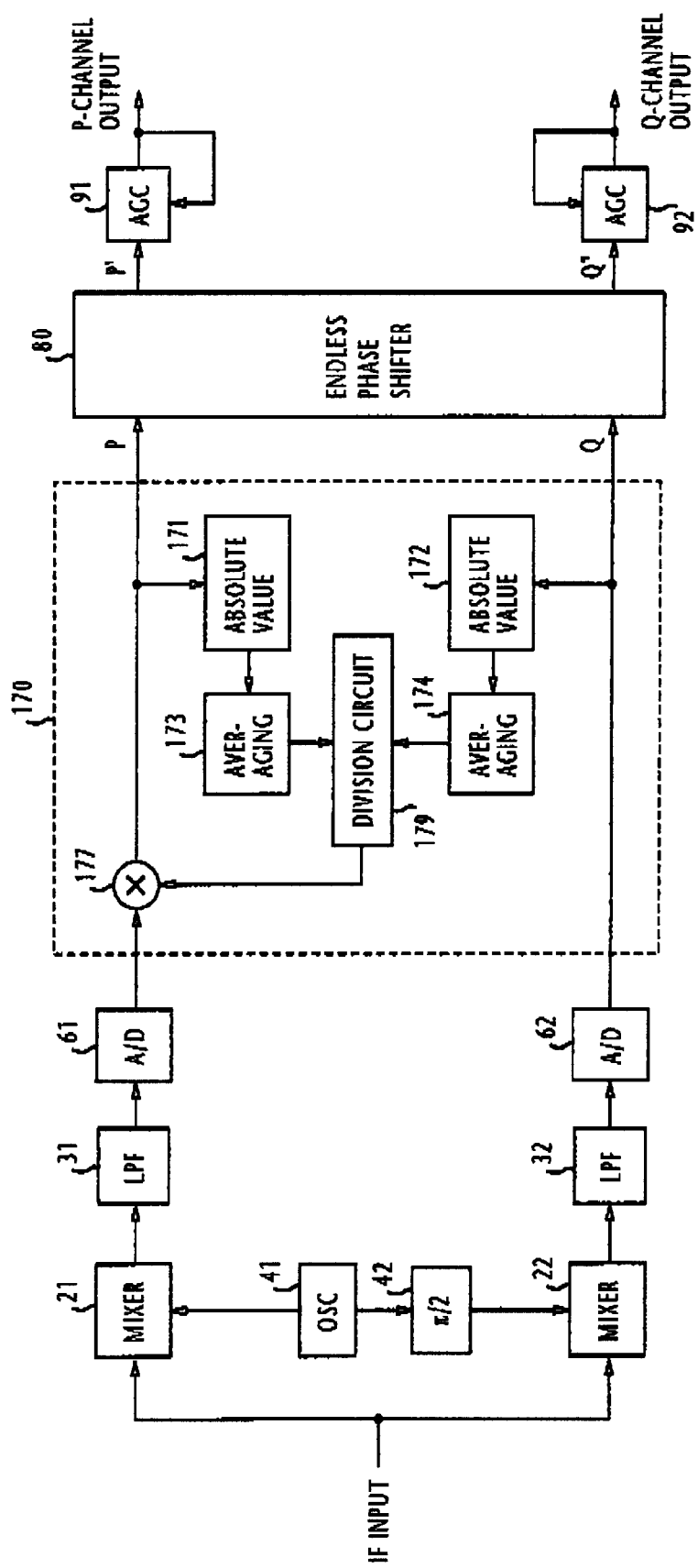
FIG. 4 is a block diagram of an incoherent demodulator according to a second embodiment of the present invention.

The AGC circuit 170 is modified as shown in FIG. 4. In this modified embodiment, a digital division circuit 179 is employed, instead of the comparator 175 and integrator 176 of FIG. 3, in order to produce an output signal representing a ratio between the two average power values obtained by the power averaging circuits 173 and 174. The ratio obtained in this way is used in the multiplier 177 to control its scaling factor. The demodulator of this invention may be implemented with a digital signal processor (DSP). In this case, the division circuit 179 is implemented with the software-based arithmetic division algorithm.

Figure 5B:
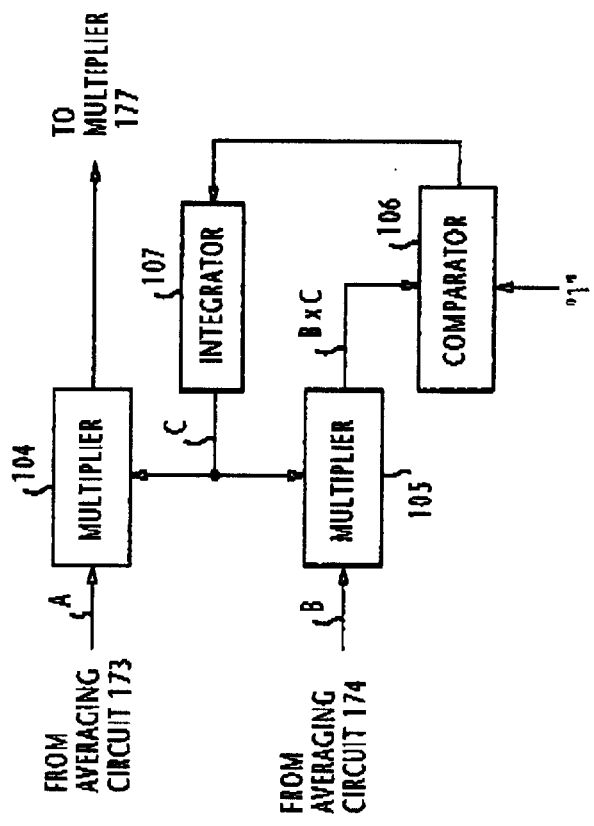
FIGS. 5A and 5B are block diagrams of hardware implementations of the arithmetic division circuits of FIG. 4.
Figure 5A:
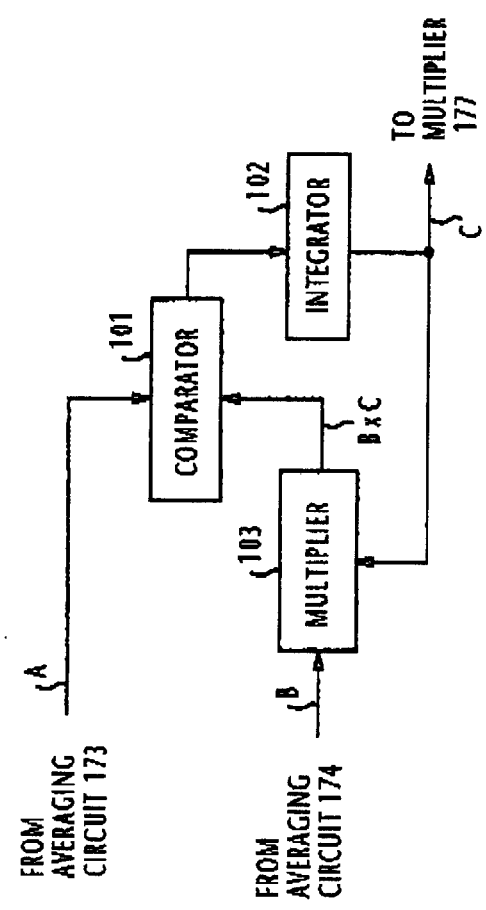

Division circuit 179 may be implemented with hardware circuitry as shown in FIG. 5A. In this case, the division circuit 179 is comprised of a comparator 101, an integrator 102 and a digital multiplier 103. The output signal A of averaging circuit 173 is applied to one input of the comparator 101 and the output signal B of averaging circuit 174 is multiplied by a scaling factor C in the multiplier 103 supplied from the integrator 102 to produce a scaled average power signal B×C. The signal B×C is applied to the second input of the comparator 101. Comparator 101 detects the difference between the signal A and the signal B×C to drive the integrator 102 with its output signal, so that a closed loop is formed. The operation of the closed loop is such that the difference between the signal A and the signal B×C reduces to zero, establishing a relation A=B×C. Hence, the ratio C=A/B is obtained at the output of integrator 102.

Alternatively, the division circuit 179 can be implemented as shown in FIG. 5B in which multipliers 104 and 105 are connected to the averaging circuits 173 and 174, respectively, for multiplying the respective average power signals A and B by a same scaling factor C supplied from an integrator 107. The output of multiplier 104 represents the nominator of the division circuit 179 and the output of multiplier 105 represents the denominator. The scaling factor C is obtained by comparing the output signal B×C of multiplier 105 to a "1" and supplying a difference value from the comparator 106 to the integrator 107, forming a closed loop. This closed loop operates in such a manner that the output of comparator 106 reduces to zero, and hence the scaled average power B×C, i.e., the denominator becomes equal to 1. When this occurs, the output signal A×C of multiplier 104 represents the ratio of average power A to average power B.

Figure 6:
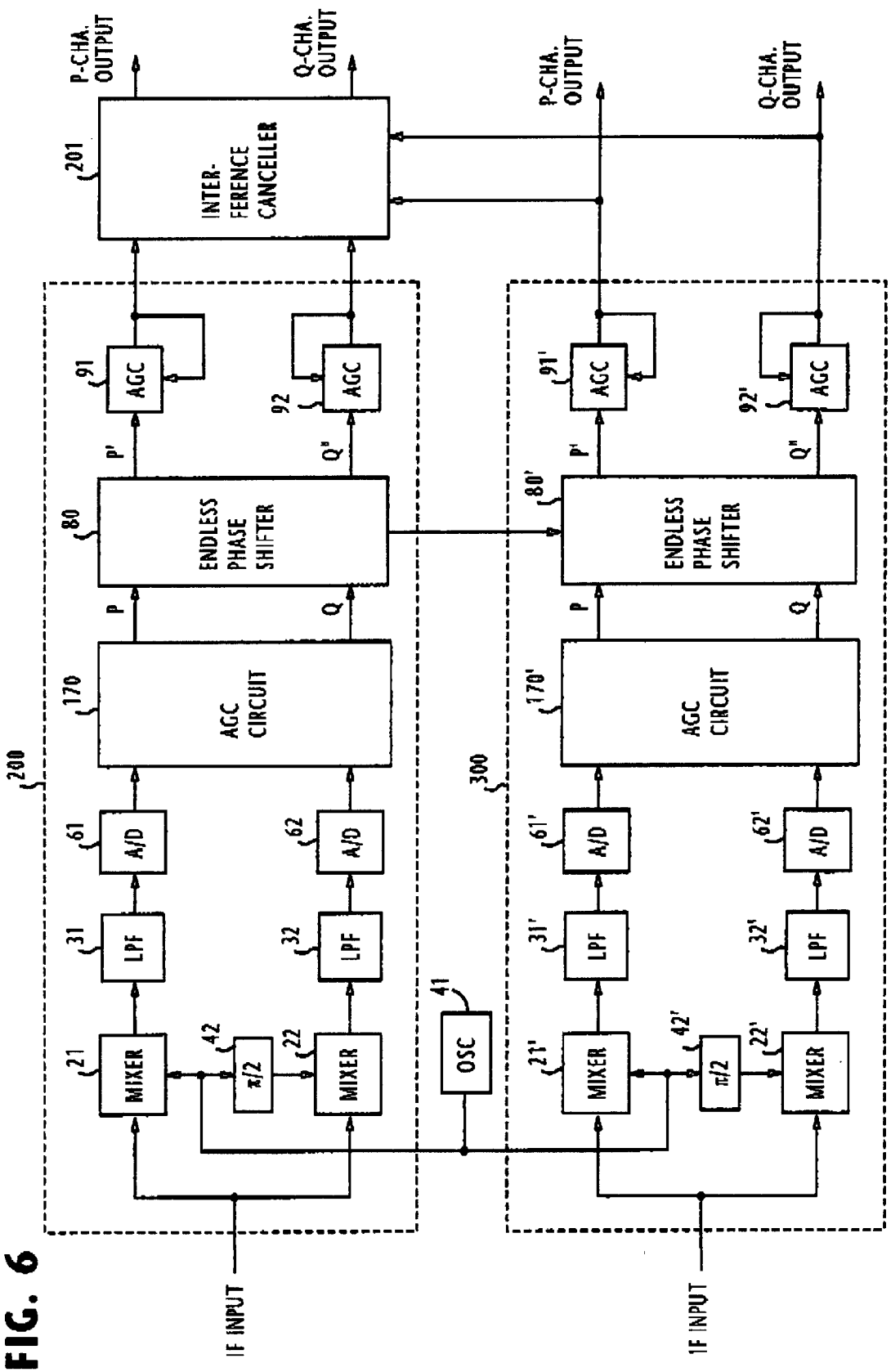
FIG. 6 is a block diagram of incoherent demodulator circuitry for a cross-polarization wireless communication system.

The present invention can be used in a demodulator for a cross-polarization wireless communication system. As shown in FIG. 6, the cross-polarization wireless communication system is comprised of a pair of first and second demodulators 200 and 300 identical in configuration to that shown in FIG. 3. Since both demodulators use the same frequency, they share the same local oscillator 41 as a common oscillator. Demodulator 200 receives a pair of modulated orthogonal IF signals transmitted on a first polarization and the demodulator 300 receives a pair of modulated orthogonal IF signals transmitted on a second polarization orthogonal to the first polarization. The numerical controlled oscillator (NCO) of the endless phase shifter 80 of the first demodulator is used as a common oscillator, so that its output is supplied to the phase shifter 80' of the second demodulator.

An interference canceller 201 is provided for receiving P- and Q-channel digital output signals of the first demodulator from the outputs of its AGC circuits 91, 92 and replicas of the P- and Q-channel digital output signals of the second demodulator from the outputs of its AGC circuits 91', 92' for cancelling interference between the two polarizations.

What is claimed is:

1. An incoherent demodulator comprising:

local oscillator circuitry for producing a pair of orthogonal carriers;

a pair of analog mixers for incoherently demodulating a pair of modulated orthogonal signals with said orthogonal carriers to produce a pair of analog orthogonal baseband signals, there being a phase rotation in said analog orthogonal baseband signals resulting from the incoherent demodulation of said modulated signals;

a pair of analog-to-digital converters for processing said analog orthogonal baseband signals to produce first and second digital signals;

gain controlled circuitry for scaling the first digital signal, said gain controlled circuitry including averaging circuitry to produce a first average value representing an average power of a scaled first digital signal, and a second average value representing an average power of said second digital signal, such that a difference which exists between the average power of the scaled first digital signal and the average power of the second digital signal reduces to zero; and a digital phase shifter for processing first and second output signals of said gain controlled circuitry so that the processed first and second output signals no longer contain said phase rotation.

2. The incoherent demodulator of claim 1, further comprising first and second automatic gain controlled circuits for respectively processing first and second digital output digital signals processed by said digital phase shifter to produce amplitude-controlled digital output whose amplitudes are maintained at a predetermined value.

3. The incoherent demodulator of claim 1, wherein said gain controlled circuitry further comprises:

a digital multiplier for multiplying said first digital signal with a control signal to produce the scaled first digital signal; and control circuitry for deriving a signal from said first and second average values and supplying the signal to said digital multiplier as said control signal so that a difference which exists between said first and second average values reduces to zero.

4. The incoherent demodulator of claim 3, wherein said control circuitry is arranged to make a comparison between the first and second average values and derives said control signal from a result of the comparison.

5. The incoherent demodulator of claim 3, wherein said control circuitry is arranged to determine a ratio between the first and second average values and derives said control signal from said ratio.

6. The incoherent demodulator of claim 5, wherein said control circuitry comprises:
   a multiplier for multiplying one of said first and second average values by a scaling factor to produce a scaled average value;
   a comparator for producing a difference signal representing a difference between the scaled average value and the other one of said first and second average values; and
   an integrator for integrating said difference signal and supplying the integrated difference signal to said multiplier as said scaling factor, whereby the scaling factor represents said ratio between the first and second average values when said difference signal becomes equal to zero.

7. The incoherent demodulator of claim 5, wherein said control circuitry comprises:
   a first multiplier for multiplying said first average value by a scaling factor to produce a scaled first average value;
   a second multiplier for multiplying said second average value by said scaling factor to produce a scaled second average value;
   a comparator for producing a difference signal representing a difference between the scaled second average value and 1; and
   an integrator for integrating said difference signal and supplying the integrated difference signal to said first and second multipliers as said scaling factor, whereby the scaled first average value represents said ratio between the first and second average values when the scaled second average value becomes equal to 1.

8. An incoherent demodulator system for a cross-polarization communication system, comprising:
   a pair of first and second demodulators for receiving first and second cross-polarized signals, respectively; and
   an interference canceller for cancelling interference between said first and second cross-polarized signals,
   each of said first and second demodulators including:
      local oscillator circuitry for producing a pair of orthogonal carriers;
      a pair of analog mixers for incoherently demodulating a pair of modulated orthogonal signals with said orthogonal carriers to produce a pair of analog orthogonal baseband signals, there being a phase rotation in said analog orthogonal baseband signals resulting from the incoherent demodulation of said modulated signals;
      a pair of analog-to-digital converters for processing said analog orthogonal baseband signals to produce first and second digital signals;
      gain controlled circuitry for scaling the first digital signal, including averaging circuitry to produce a first average value representing an average power of a scaled first digital signal, and a second average value representing an average power of said second digital signal, such that a difference which exists between the average power of the scaled first digital signal and the average power of the second digital signal reduces to zero;
      a digital phase shifter for processing the first and second output signals of said gain controlled circuitry so that the processed first and second output signals no longer contain said phase rotation; and
      first and second automatic gain controlled (AGC) circuits for respectively processing the first and second digital output signals processed by said digital phase shifter to produce amplitude-controlled digital output signals whose amplitudes are maintained at a predetermined value,
   the amplitude-controlled digital output signals produced by the first and second AGC circuits of said first demodulator being supplied to said interference canceller, and replicas of the amplitude-controlled digital output signals produced by the first and second AGC circuits of said second demodulator being supplied to said interference canceller as interference cancelling signals.

9. A demodulation method comprising:
   incoherently demodulating a pair of modulated orthogonal signals with a pair of orthogonal carriers to produce a pair of analog orthogonal baseband signals, there being a phase rotation in said analog orthogonal baseband signals resulting from the incoherent demodulation of said modulated signals;
   converting said analog orthogonal baseband signals to first and second digital signals;
   scaling the first digital signal, to produce a first average value representing an average power of a scaled first digital signal, and a second average value representing an average power of said second digital signal, such that a difference which exists between the average power of the scaled first digital signal and the average power of the second digital signal reduces to zero; and
   removing said phase rotation which exists between the scaled first digital signal and the second digital signal.

10. The method of claim 9, wherein said scaling the first digital signal comprises:
    multiplying said first digital signal with a control signal to produce a scaled first digital signal; and
    deriving a signal from said first and second average values and using the signal as said control signal so that a difference which exists between said first and second average values reduces to zero.

11. The method of claim 10, wherein said deriving a signal from said first and second average values comprises making a comparison between the first and second average values and deriving said control signal from a result of the comparison.

12. The method of claim 10, wherein said deriving a signal from said first and second average values comprises determining a ratio between the first and second average values and deriving said control signal from said ratio.

13. The incoherent demodulator of claim 1, wherein said averaging circuitry includes said phase rotation in the calculation of said first average value representing the average power of the scaled first digital signal and said second average value representing the average power of said second digital signal.

14. The incoherent demodulator of claim 2, wherein said gain controlled circuitry operates independently of the operation of said first and second automatic gain controlled circuits.

15. The incoherent demodulator system of claim 8, wherein said averaging circuitry includes said phase rotation in the calculation of said first average value representing the average power of the scaled first digital signal and said second average value representing the average power of said second digital signal.

16. The incoherent demodulator system of claim 8, wherein said gain controlled circuitry operates independently of the operation of said first and second automatic gain controlled circuits.

* * * * *